United States Patent [19]

Fanjoy

[11] Patent Number: 5,883,807

[45] Date of Patent: Mar. 16, 1999

[54] SCHEMATIC SYNTHESIZER

[76] Inventor: Logan M. Fanjoy, 595 West LaDonna, Tempe, Ariz. 85282

[21] Appl. No.: 730,926

[22] Filed: Oct. 18, 1996

[51] Int. Cl.$^6$ .................................................. G06F 17/50
[52] U.S. Cl. ......................... 364/488; 364/489; 364/491
[58] Field of Search ................................... 364/488, 489, 364/490, 491, 578; 395/500

[56] References Cited

U.S. PATENT DOCUMENTS

| | | | |
|---|---|---|---|
| 5,544,067 | 8/1996 | Rostoker et al. | 364/489 |
| 5,555,201 | 9/1996 | Dangelo et al. | 364/489 |
| 5,610,832 | 3/1997 | Wikle et al. | 364/491 |

*Primary Examiner*—Kevin J. Teska
*Assistant Examiner*—Matthew Loppnow
*Attorney, Agent, or Firm*—Meschkow & Gresham, P.L.C.; Lowell W. Gresham; Jordan M. Meschkow

[57] ABSTRACT

A schematic diagram (32) for a printed circuit board (34) is synthesized (20) from a physical design file (56) and a graphical symbol file (86). The printed circuit board (34) has a plurality of parts (36) at least one of which has a plurality of pins (38), those parts (36) and pins (38) being defined in the physical design file (56), from which physical attributes (60) are extracted (58). The finished schematic diagram (32) will include a plurality of symbols (40) at least one of which has a plurality of nodes (41), those symbols (40) and nodes (41) being contained in the graphical symbol file (86) from which graphical attributes (90) are extracted (88). These physical attributes (60) and graphical attributes (90) are integrated (26) along with operator determined position data (168) to produce schematic application page files (30). These schematic application page files (30) may then be processed by a schematic drawing program (156) to plot (158) the finished schematic diagram (32) on a visual medium.

17 Claims, 10 Drawing Sheets

SCHEMATIC SYNTHESIZER

TECHNICAL FIELD OF THE INVENTION

The present invention pertains to the creation of a schematic diagram. More specifically, the present invention pertains to a method of creating a schematic diagram retroactively from a manufacturer's printed circuit board physical design data.

BACKGROUND OF THE INVENTION

There often occurs a need to create or re-create a schematic diagram of a circuit already realized in printed-circuit form. Such a need may occur because the original schematic has been lost or damaged, or, perhaps more commonly, because modifications and revisions to the circuit have been made over time but not reflected in the original schematic.

Regardless of the reason for the need, current practice requires that a schematic be created manually by correlating all parts and connections on the printed circuit board. This process is time-intensive, tedious, and prone to error.

A marked disadvantage of creating schematics manually is the inherent inflexibility in this process. Once created, such a mechanical schematic does not lend itself readily to modification nor to reorganization.

SUMMARY OF THE INVENTION

Accordingly, it is an advantage of the current invention that it automates and simplifies the process of creating a schematic diagram from original printed-circuit data. This advantage is accomplished, in one form, by an improved method for the synthesization of a schematic diagram from a printed circuit board by extracting physical attributes from the printed circuit board's physical design data file, extracting graphical attributes from a schematic drawing program's graphical symbol data file, and integrating those attributes to produce a schematic application page file suitable for that schematic drawing program.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENT

Figure 1:
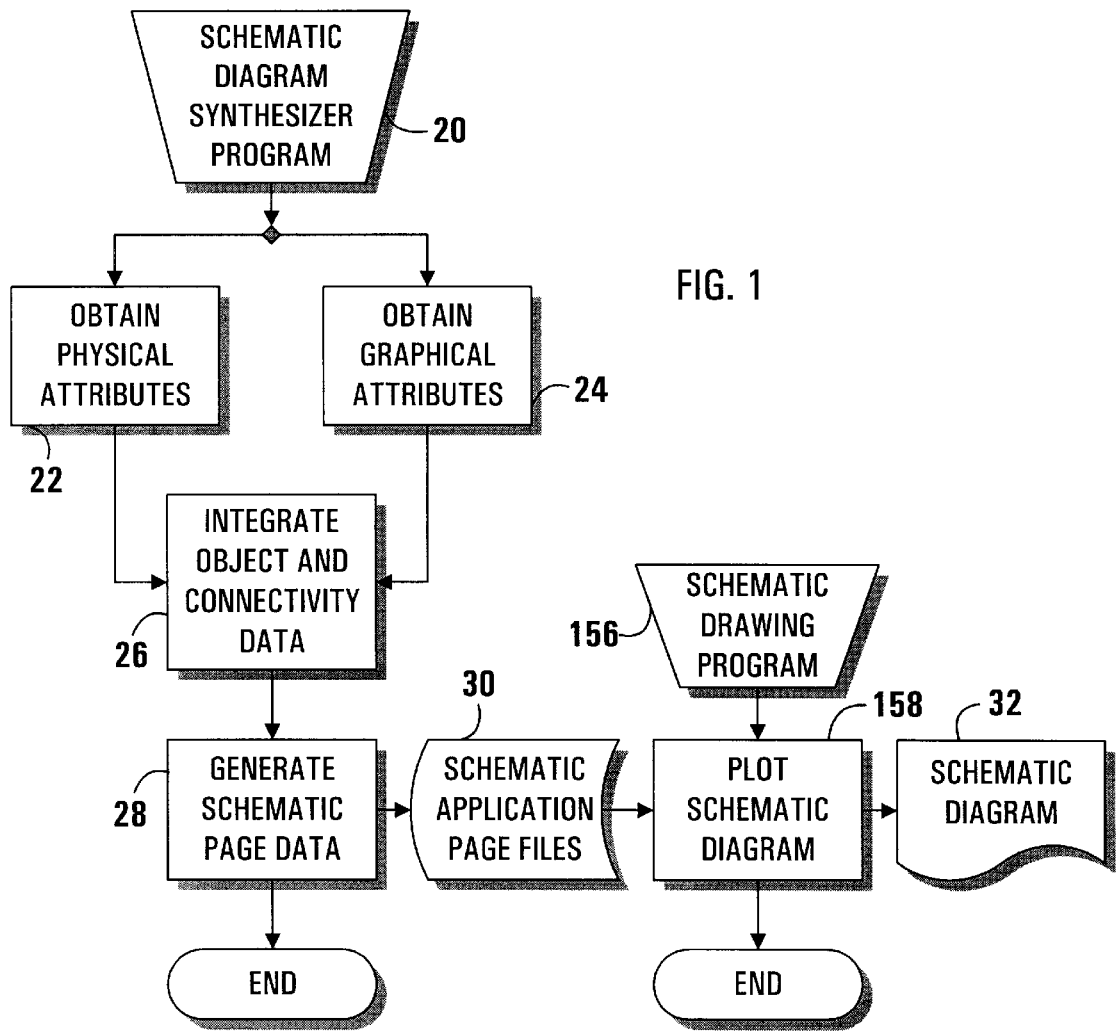
FIG. 1 is a flowchart depicting an overall view of a process to generate a schematic diagram from printed circuit board design data.

FIG. 1 depicts a flowchart of processes used by schematic diagram synthesizer program 20. In the preferred embodiment, program 20 is executed on an industry-standard IBM-compatible personal computer system or network thereof (not shown), having a memory or memories in or upon which program 20 may be executed and data may be stored, and which computer system or network with associated memory shall hereinafter be referred to as the system.

Program 20 is computer code defining and causing the system to perform the processes and tasks required to effect a goal of producing schematic application page files 30, from which a finished schematic diagram 32 may be produced.

These schematic application page files 30 may be used as input for a draw schematic program 156, also executed on the system. Program 156 includes a plot schematic diagram task 158, which causes finished schematic diagram 32 to be realized on a visual medium. As examples, the visual medium may be a video monitor, paper, transparency, etc.

The flowchart in FIG. 1 outlines various processes utilized by schematic diagram synthesizer program 20 to generate the schematic application page files 30. The processes incorporated into program 20 include: an obtain physical attributes process 22, an obtain graphical attributes process 24, an integrate object and connectivity data process 26, and a generate schematic page data process 28. The resultant composite data generated by these processes are then formatted and stored as schematic application page files 30.

Figure 2:
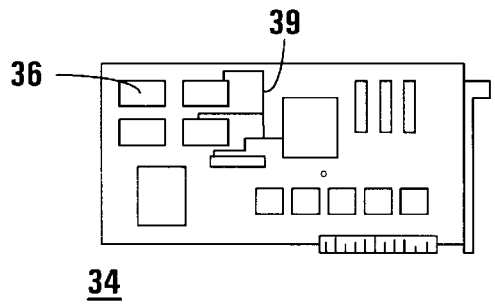
FIG. 2 is a plan view of a typical printed circuit board.
Figure 3:
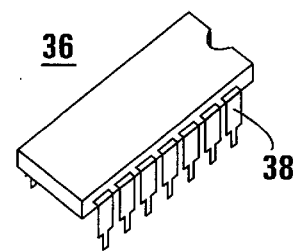
FIG. 3 is an anisometric view of a typical part.

An original printed circuit board 34, as exemplified in FIGS. 2 and 3, has a plurality of parts 36, each of which parts 36 has at least one pin 38, and a plurality of traces 39 interconnecting those pins 38 of those parts 36.

Figure 4:
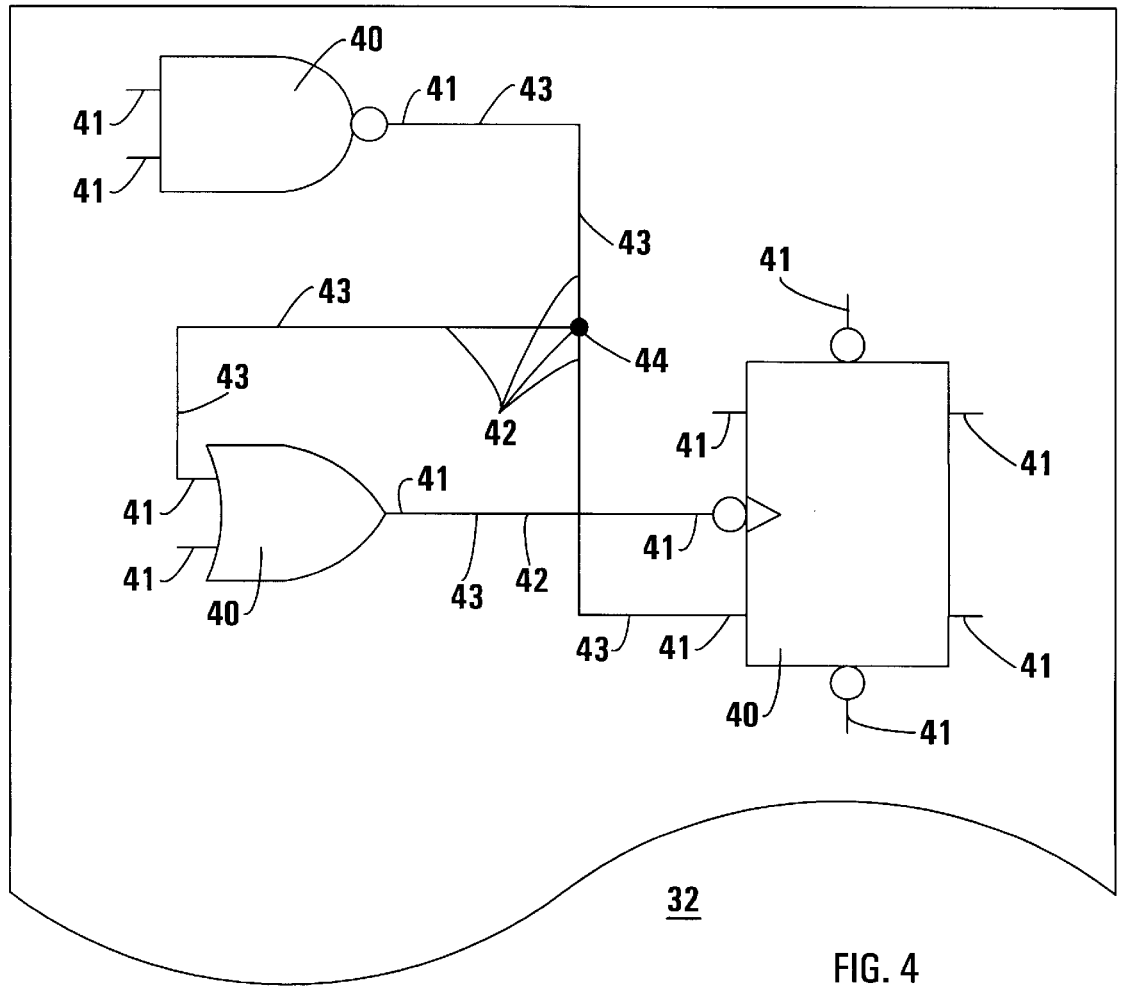
FIG. 4 is a example of a schematic diagram illustrating typical logic symbols and nets.

In addition, a finished schematic diagram 32, as exemplified in FIG. 4, has a plurality of symbols 40, each of which symbols 40 has at least one node 41, and a plurality of connection networks 42, hereinafter called nets 42, interconnecting those nodes 41 of those symbols 40. Each of which nets 42 has at least one straight-line segment 43 and may have one or more junctions 44.

In general, schematic diagram synthesizer program 20 correlates parts 36 of original printed circuit board 34 with symbols 40 which will be included in finished schematic diagram 32. Pins 38 of each of those parts 36 are correlated with nodes 41 of each of those symbols 40, and traces 39 interconnecting those pins 38 are translated into nets 42 interconnecting those nodes 41.

Figure 5:
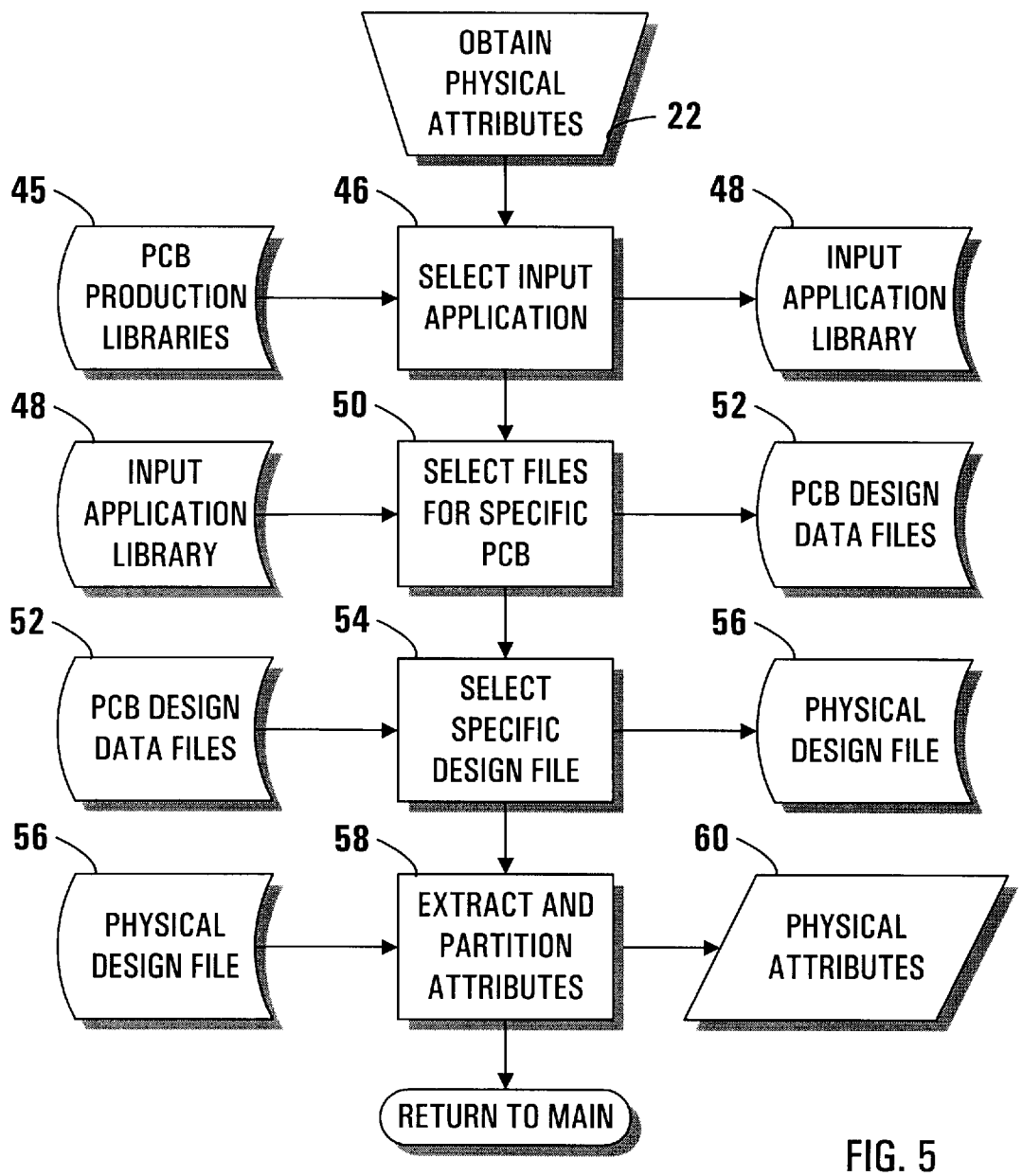
FIG. 5 is a flowchart depicting a process to obtain physical attributes.

FIG. 5 is a flowchart depicting obtain physical attributes process 22 (see FIG. 1). In process 22, a system operator makes a series of selections from those files used in the manufacture of printed circuit boards 34.

In a task 46 of process 22, the operator selects an input application library 48. The operator chooses from among the printed circuit board (PCB) production libraries 45 to find a specific input application library 48 desired. The printed circuit board production libraries 45 are those libraries of files of all methods of manufacturing a printed circuit board (input applications). Once the selection has been made, only the input application library 48 for this specific printed circuit board 34 remains, thus defining the input application.

In task 50 of process 22, the operator selects files for printed circuit board 34. The operator chooses from among the files in the input application library 48 to find the set of printed circuit board design data files 52 for the specific printed circuit board 34 in question. The printed circuit board design data files 52 are those files, usually grouped as a library, that contain all the data required to make printed circuit board 34 but no other printed circuit boards.

In a task 54 of process 22, the operator selects a physical design file 56. The operator chooses from among the printed circuit board design data files 52 for printed circuit board 34 to find physical design file 56 containing component data. Other files 56, which are not selected in task 54, may contain process data, hole sizes, etc.

Once the operator has selected an appropriate physical design file 56, schematic diagram synthesizer program 20 (see FIG. 1) then performs a task 58 to extract and partition physical attributes 60. Physical attributes 60 are those data pertaining to parts 36 of printed circuit board 34, pins 38 of those parts 36, and traces 39 interconnecting those pins 38 (see FIGS. 2 and 3).

Figure 6:
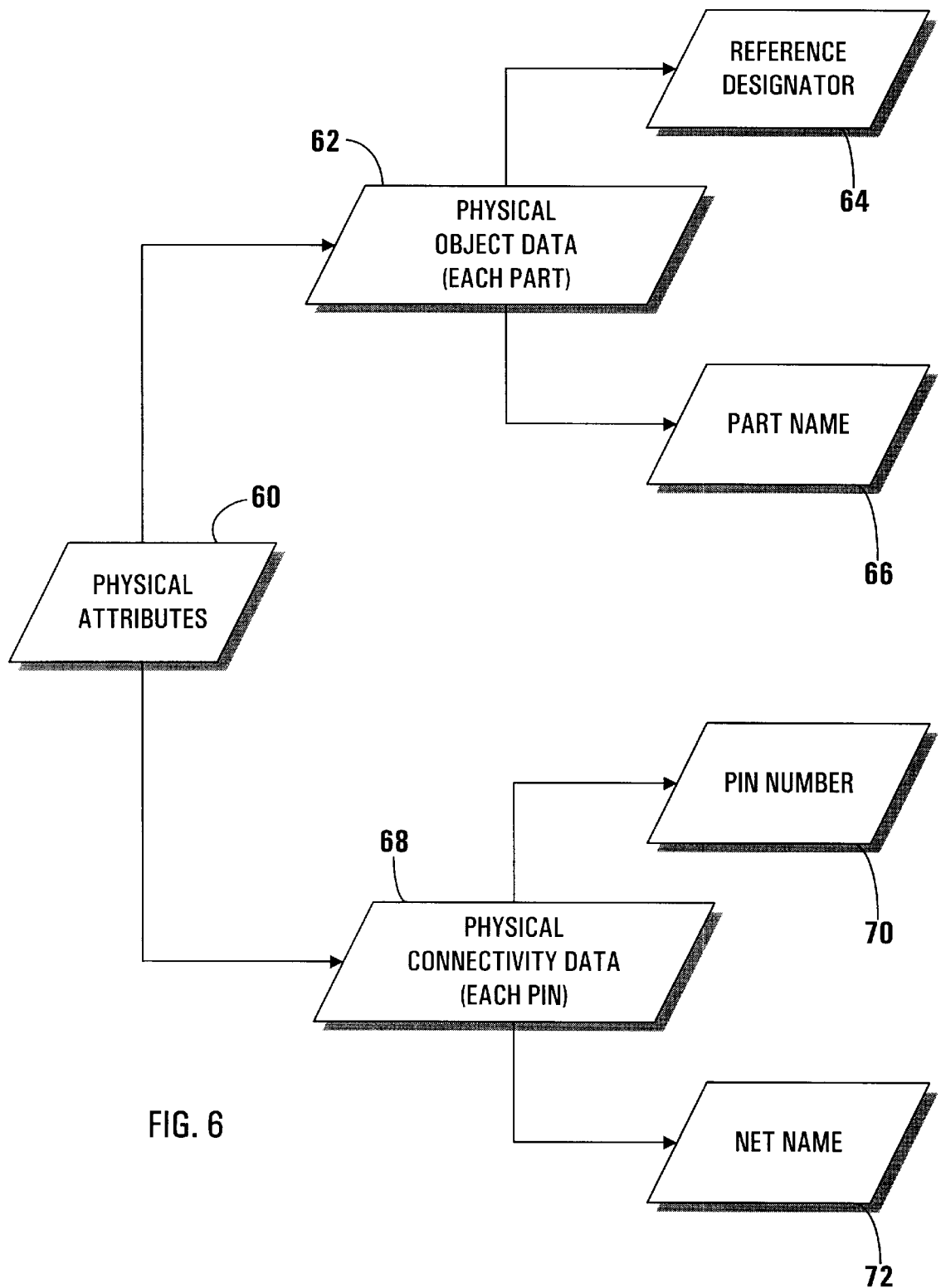
FIG. 6 is a schema depicting constituent elements of the physical attributes.

FIG. 6 shows a schema depicting constituent elements of physical attributes 60. Physical attributes 60 have been partitioned into physical object data 62 and physical connectivity data 68.

Physical object data 62 define each part 36 on printed circuit board 34 as distinct from every other part 36 on that board 34, and includes a reference designator datum 64 and a part name datum 66.

Reference designator datum 64 is a board-unique part designation, e.g. "U1". That is, in our example there can be one and only one "U1" in the domain of all parts 36 encompassed by a specific printed circuit board 34. A different printed circuit board 34 would constitute a different domain and, as such, not be considered.

Part name datum 66 is an industry-standard part identification nomenclature, e.g. "54F00", establishing the functional identity of part 36.

Physical connectivity data 68 define each pin 38 on a given part 36 as distinct from every other pin 38 on that part 36, and includes a pin number datum 70 and a net name datum 72.

Pin number 70 is a part-unique pin designation, e.g. "Pin 1". That is, in our example there can be one and only one "Pin 1" in the domain of all pins 38 encompassed by a specific part 36.

Net name 72, on the other hand, is a board-unique designation for the trace 39 that connects to the specified pin 38, e.g. "Refresh Clock". Every trace 39 on a given printed circuit board 34 has a board-unique net name 72. That is, in our example there can be one and only one "Refresh Clock" in the domain of all traces 39 encompassed by printed circuit board 34. Every pin 38 of every part 36 that connects to a given trace 39 has the net name 72 of that trace 39, hence providing inter-part connectivity.

Figure 7:
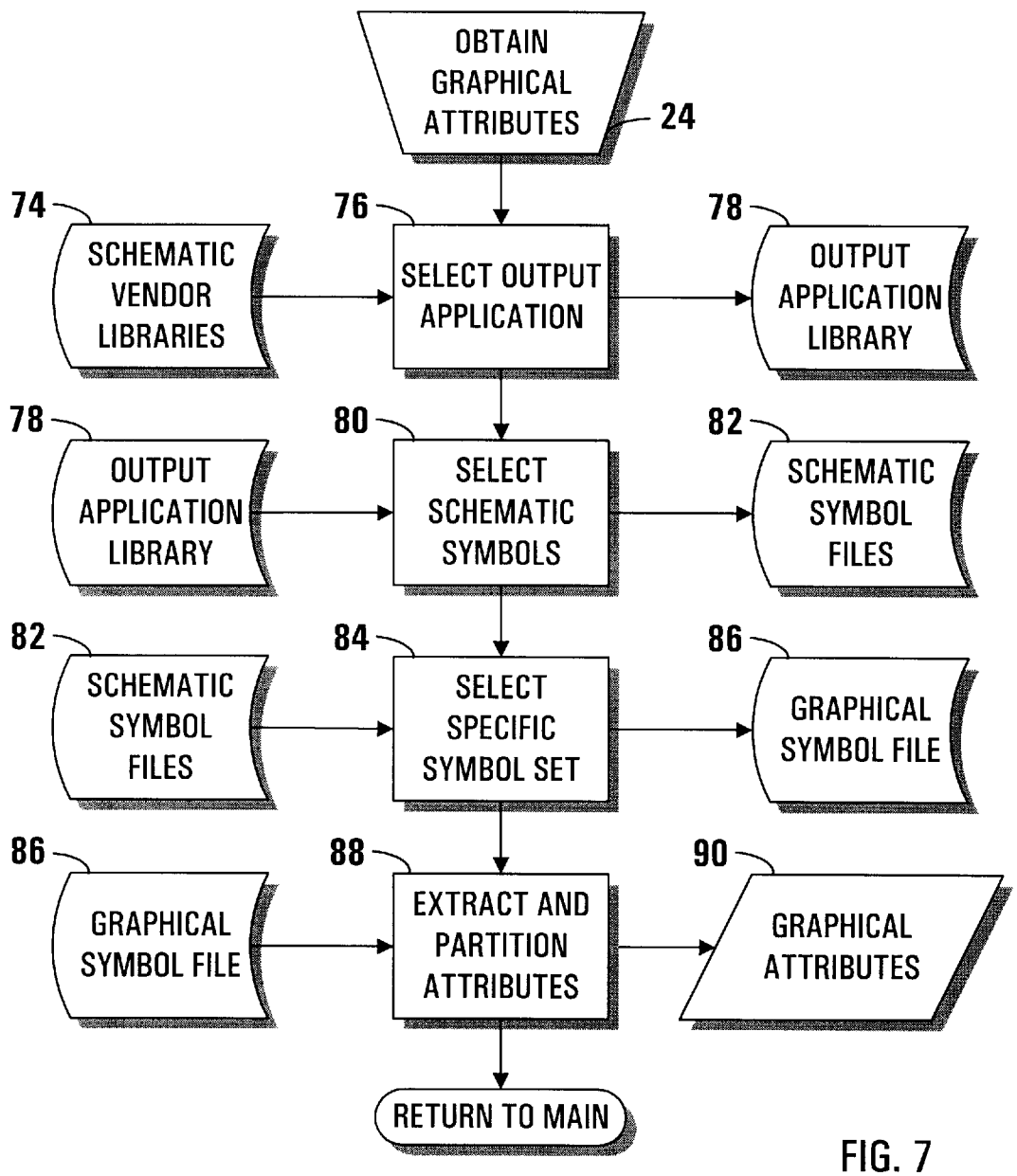
FIG. 7 is a flowchart depicting a process to obtain graphical attributes.

FIG. 7 is a flowchart depicting obtain graphical attributes process 24 (see FIG. 1), and is analogous to obtain physical attributes process 22 already discussed. In process 24, the operator makes a series of selections from those files used in the generation of finished schematic diagrams 32.

In a task 76 of process 24, the operator selects an output application 78. The operator chooses from among schematic vendor libraries 74 to find a desired output application library 78. Schematic vendor libraries 74 are those libraries of program and program-support files for various methods of plotting 158 (see FIG. 1) a finished schematic diagram 32 as provided by various vendors of schematic drawing programs 156 (output applications).

In a task 80 of process 24, the operator selects schematic symbol files 82. The operator chooses from among the files in output application library 78 to find desired schematic symbol files 82. The schematic symbol files 82 are those files, usually grouped as a library, that contain all the data required to make a schematic diagram of various types, but only schematic diagrams (as opposed to parts-placement diagrams, pinout diagrams, etc.).

In task 84 of process 24, the operator selects a specific graphic symbol file 86. The operator chooses from among schematic symbol files 82 for graphical symbol file 86 which includes the symbological data required to produce a finished schematic diagram 32 of the desired type (analog, digital, etc.).

Once the operator has selected graphical symbol file 86, schematic diagram synthesizer program 20 (see FIG. 1) may then perform a task 88 to extract and partition graphical attributes. Graphical attributes 90 are those data pertaining to symbols 40 of finished schematic diagram 32, nodes 41 of those symbols 40, and the nets 42 interconnecting those nodes 41 (see FIG. 4).

Figure 8:
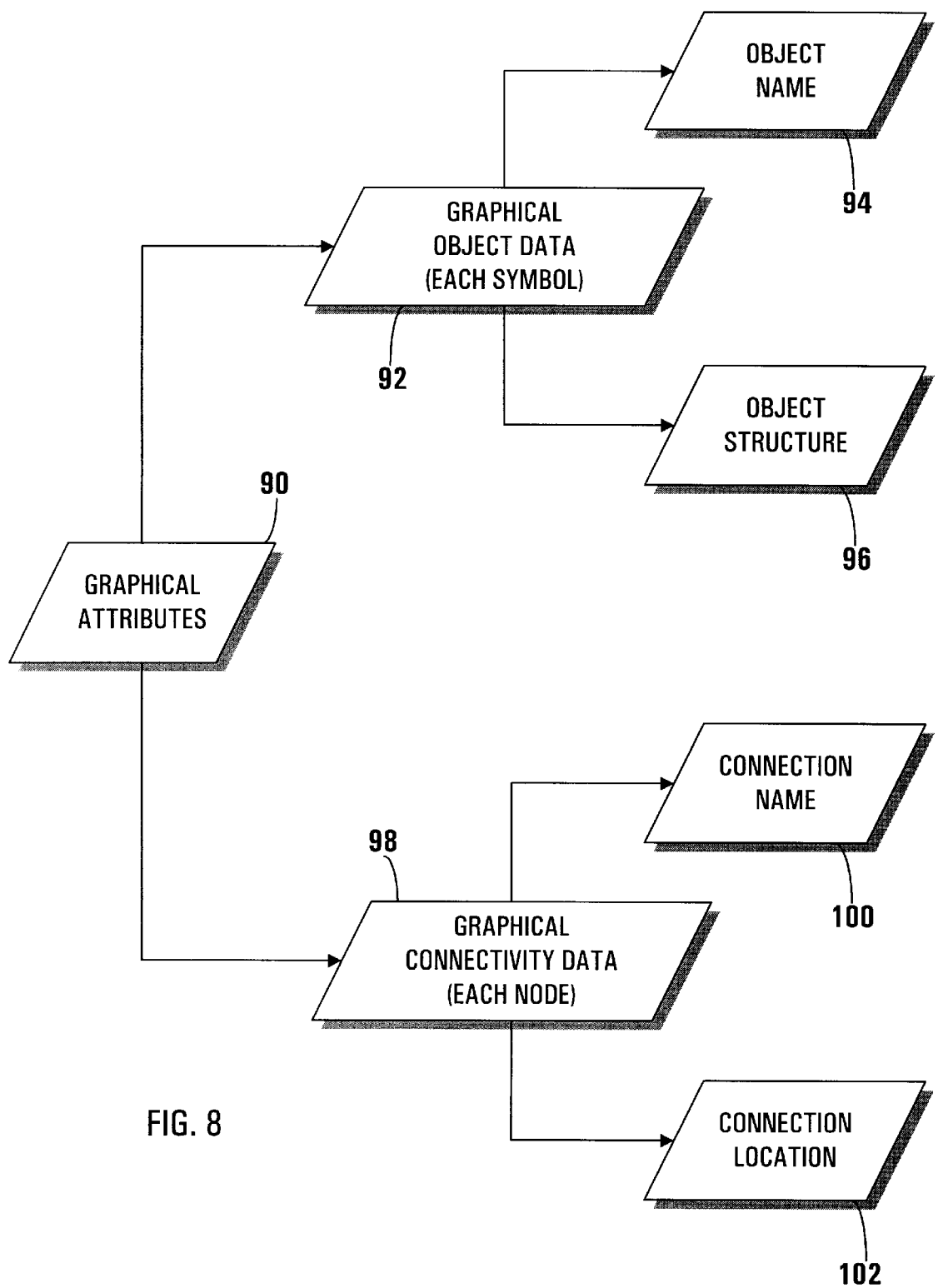
FIG. 8 is a schema depicting constituent elements of the graphical attributes.

FIG. 8 shows a schema depicting constituent elements of graphical attributes 90. Graphical attributes 90 have been partitioned into graphical object data 92 and graphical connectivity data 98.

Graphical object data 92 define each symbol 40 of graphical symbol file 86 (see FIG. 7) as distinct from every other symbol 40 in that file 86, and includes an object name datum 94 and an object structure datum 96.

Object name datum 94 is an industry-standard symbol identification nomenclature, e.g. "54F00:A", analogous to part name datum 66 already discussed.

Object structure datum 96, is a descriptive designation or other identifier (usually encoded) of the graphical representation of symbol 40, e.g. "Two-Input NAND Gate".

Graphical connectivity data 98 define each node 41 of each symbol 40 as distinct from every other node 41 on that symbol 40, and includes a connection name datum 100 and a connection location datum 102.

Connection name datum 100 is a symbol-unique node designation, e.g. "1:Input A". That is, in our example there can be one and only one "1:Input A" in the domain of all nodes 41 encompassed by a given symbol 40.

Connection location 102 is a symbol-unique description of the location of node 41 relative to a reference point in symbol 40. E.g., this may be a Cartesian offset to a predetermined point in symbol 40, in "X1,Y1" form. Since the location of a given node 41 must be symbol-unique, our example can have one and only one "X1,Y1" in the domain of all nodes 41 encompassed by a given symbol 40.

Those skilled in the art may readily conceive of alternate ways of obtaining physical attributes 60 and graphical attributes 90, and that these attributes themselves may assume differing forms. Conventional file selection techniques may be used.

Figure 9:
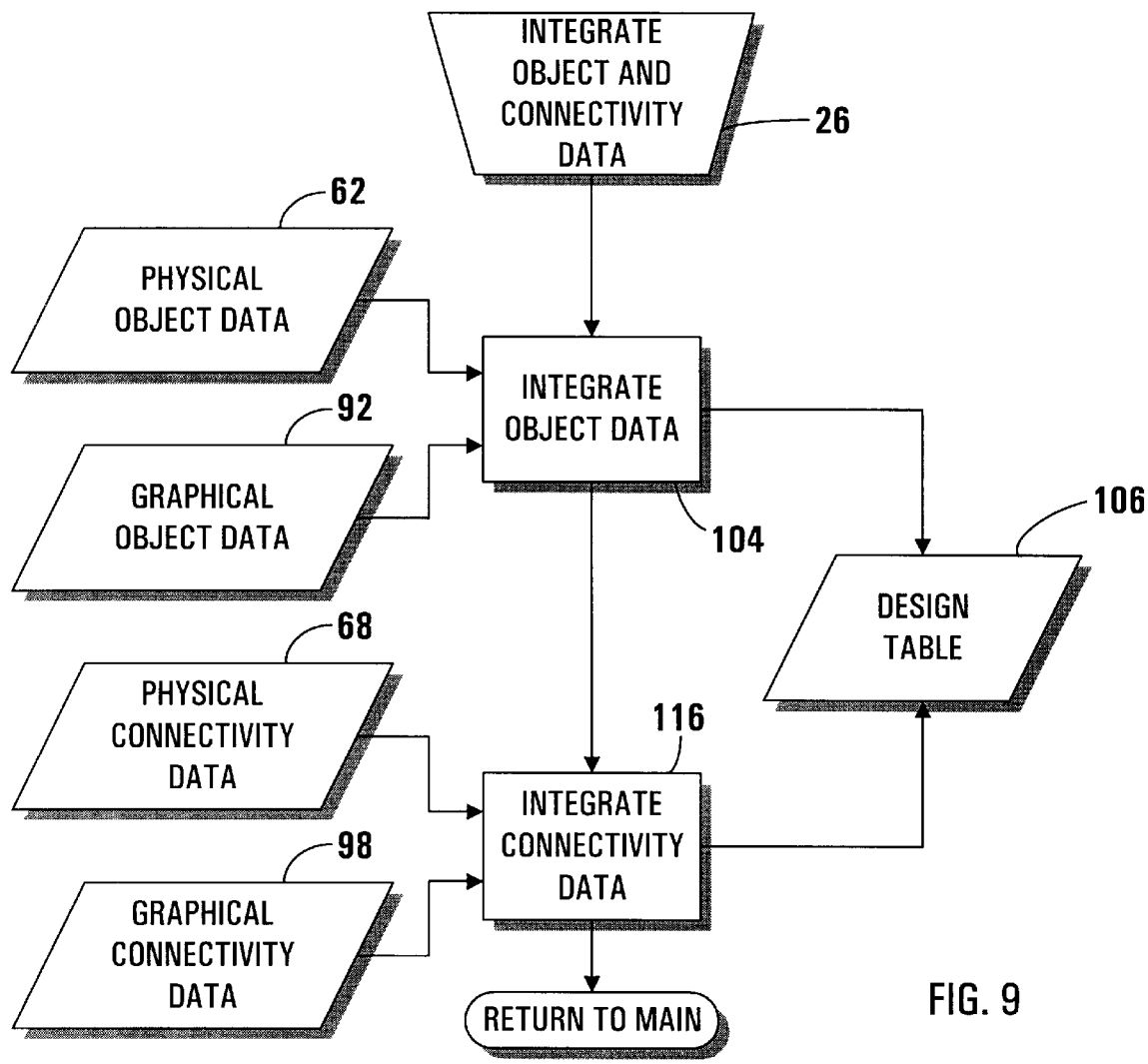
FIG. 9 is a flowchart depicting a process to integrate object and connectivity data.

FIG. 9 depicts an integrate object and connectivity data process 26. The resultant integrated data generated during process 26 is placed into a design table 106. The exemplary manner of integration is itself depicted in FIG. 10.

As discussed above, physical object data 62 are those data that define each individual part 36 as unique from all other parts 36 on printed circuit board 34, and graphical object data 92 are those data that define each individual symbol 40 in graphical symbol file 86 as unique from all other symbols 40 in that file 86. That is, object data are data at the part/object/symbol level.

It should be noted that in accordance with the exemplary data discussed above, a "54F00" is an industry-standard part which is a "quad two-input NAND gate". This means that the one part name datum 66 "54F00" in the physical object data correlates with at least four object name data 94, "54F00:A", "54F00:B", etc. This is because each of the four NAND gates within the part may be independently used in the finished schematic diagram 32, hence requiring a separate NAND gate symbol 40. Additional symbols 40 may be provided for power and ground. It is this steadily-increasing relationship, 1 to N to N+M . . . , which is accommodated in the integration and association of the data.

Integrate object and connectivity data process 26 includes an integrate object data task 104. In task 104, physical object data 62 and graphical object data 92 are associated with one another and processed, with resultant composite data inserted into design table 106.

Part name datum 66, e.g. "54F00", is associated with object name datum 94, e.g. "54F00:A", to produce a symbol name datum 112, e.g. "54F00:A". For this example, there are at least four object name data 94 associated with part name datum 66, so there are at least four symbol name data 112 produced for the part 36, one for each symbol 40 to be on the finished schematic diagram 32 (see FIGS. 2–4).

The count of the number of symbol name data 112 associated with each reference designator 64 are summed with the resultant being a number of symbols datum 108.

Reference designator datum 64, e.g. "U1", is merged with symbol name datum 112, e.g. "54F00:A", to become a symbol designator datum 110, e.g. "U1A", and provides a schematic-unique designation for each symbol 40 to be on the finished schematic diagram 32. That is, in our example there can be one and only one "U1A" in the domain of all symbols 40 encompassed by the finished schematic diagram 32.

Object structure datum 96, e.g. "two-input NAND gate #1", becomes a symbol structure datum 114, e.g. "two-input NAND gate #1", for each symbol 40, and completes integrate object data task 104.

As discussed above, physical connectivity data 68 are those data that define each individual pin 38 on each part 36 as unique from all other pins 38 on that part 36 and graphical connectivity data 98 are those data that define each individual node 41 on each symbol 40 as unique from all other nodes 41 on that symbol 40. That is, connectivity data are data at the pin/connection/node level.

Process 26, as shown in FIG. 9, includes an integrate connectivity data task 116. In task 116, physical connectivity data 68 and graphical connectivity data 98 are associated with one another and processed, with resultant composite data being inserted into design table 106.

Figure 10:
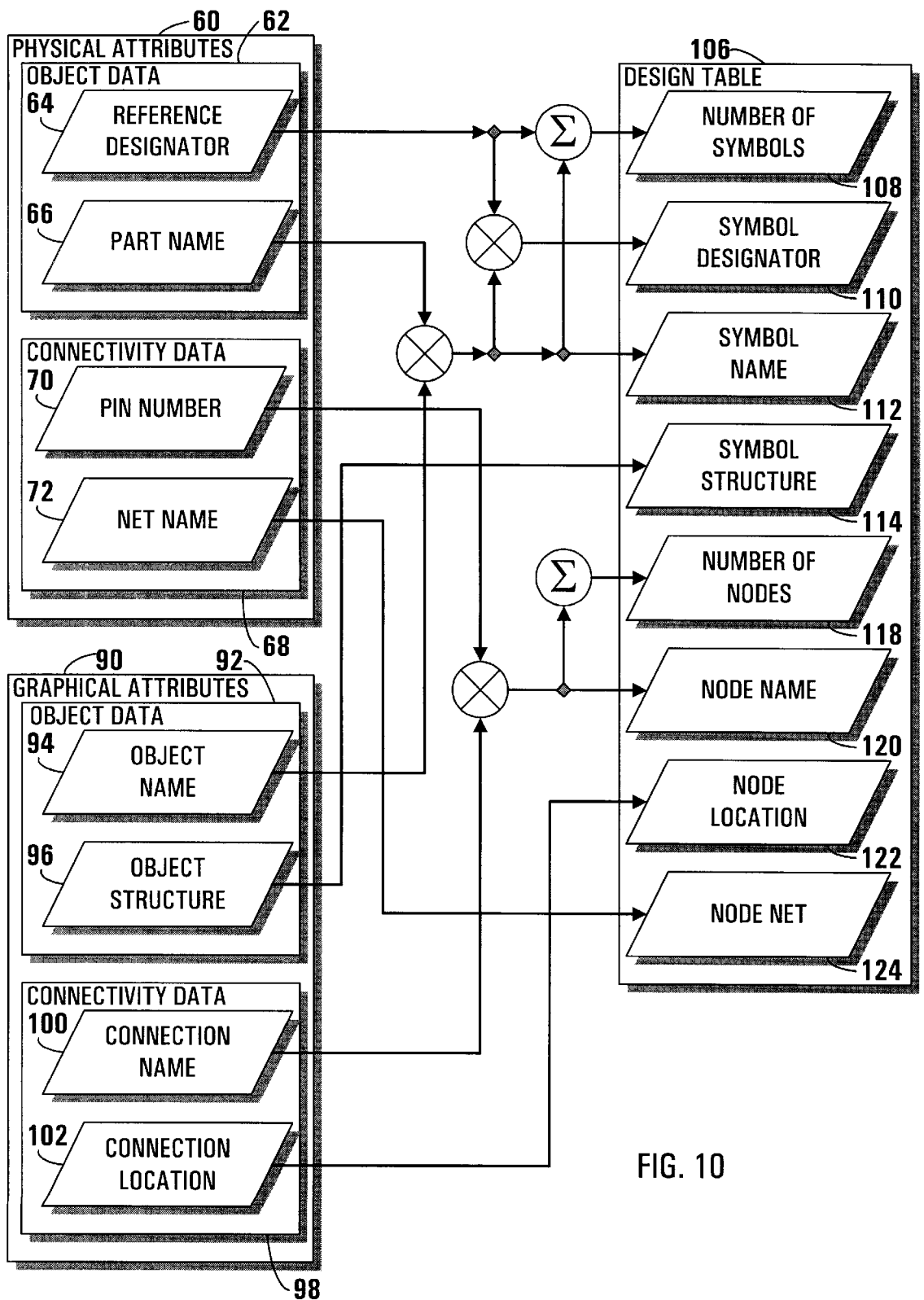
FIG. 10 is a schema depicting a relationship between physical and graphical attributes and design table symbol data.

As shown in FIG. 10, pin number datum 70, e.g. "Pin 1", is merged with connection name datum 100, e.g. "1:Input 1A", with the resultant being a node name datum 120, e.g. "1:Input 1A" stored in design table 106.

The count of all node names data 120 for a given symbol 40 becomes a number of nodes datum 118, for that symbol.

There is a distinct and direct correlation between pin number datum 70 and connection name datum 100. Pin number datum 70 refers to each physical pin 38 on a given part 36. Connection name datum 100, on the other hand, refers to each node 41 of a given symbol 40, where there may be more than one symbol 40 for a given part 36. The sum of all nodes 41 for all symbols 40 for a given part 36 is equal to the sum of all pin number data 70 for that part 36. Each of those nodes 41 has a direct one-to-one correlation with a given pin number datum 70.

Each connection location datum 102, e.g. "X1,Y1", from graphical connectivity data 98, becomes an equivalent node location datum 122, e.g. "x,y", relative to a reference point in symbol 40, in design table 106.

Each net name datum 72, e.g. "Refresh Clock", from physical connectivity data 68, becomes an equivalent node net datum 124, e.g. "Refresh Clock", in design table 106, and completes integrate connectivity data task 116.

Figure 11:
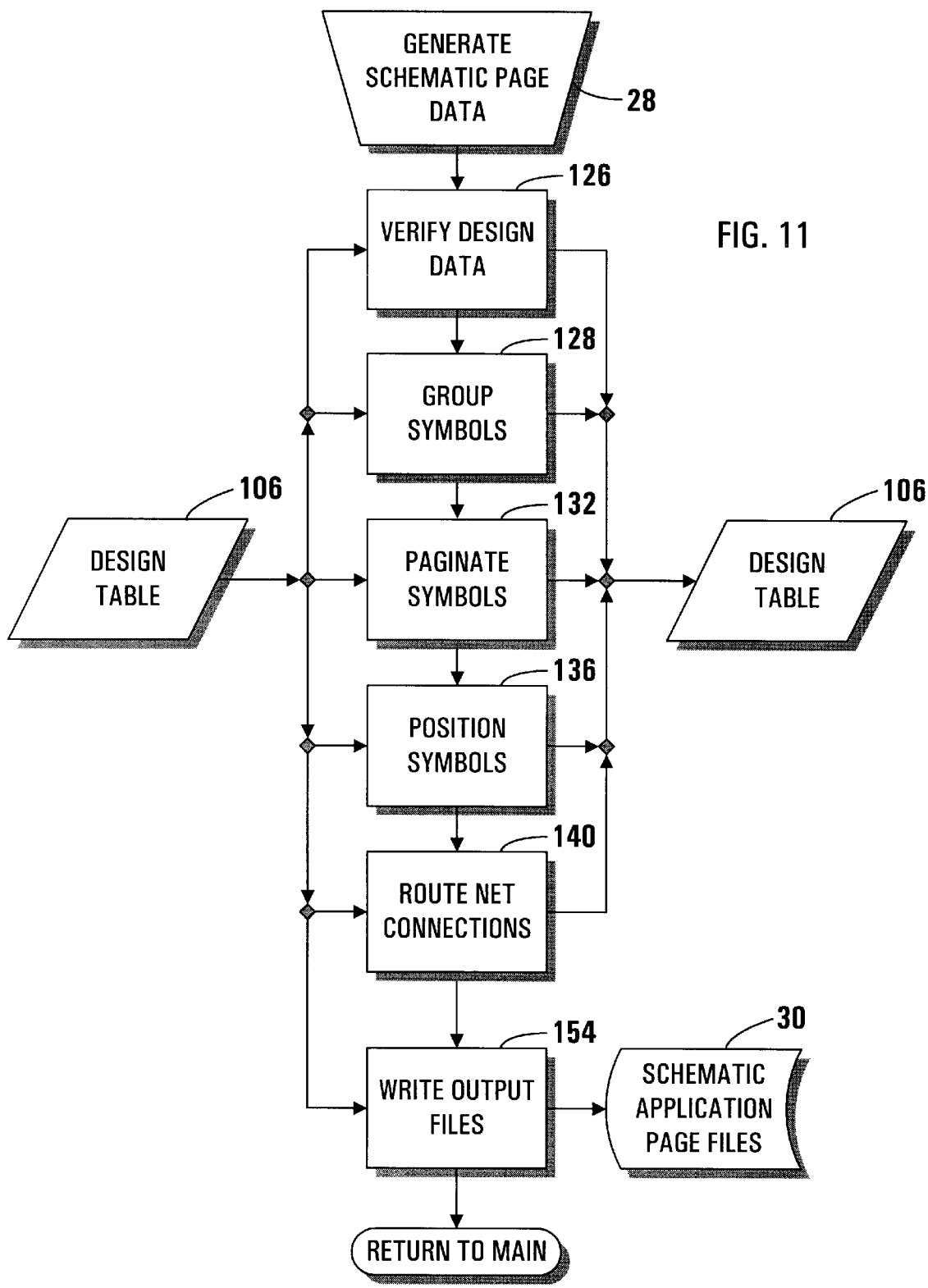
FIG. 11 is a flowchart depicting a process to generate schematic page data.

FIG. 11 is a flowchart depicting generate schematic page data process 28 (see FIG. 1). Process 28 includes tasks 126, 128, 132, 136, 140, and 154. Each of these tasks is interactive. That is, the system performs these tasks interactively with operator input and under operator control.

Process 28 includes verify design data task 126, wherein the operator correlates and inspects the data compiled into design table 106 thus far. All these data have been generated by the integration of object data and connectivity data as depicted in FIGS. 9 and 10.

Those skilled in the art will appreciate that design table 106 need not contain only a small amount of data. E.g., for the simple 14-pin part example discussed above, "54F00", design table 106 would at this stage contain 65 data items (see FIGS. 10 and 12) as shown in the following table (items with an asterisk "*" after the reference number are data items, the rest are data groups):

| Data Group/Datum | Ref | Example |
| --- | --- | --- |
| Symbol Data Group | 160 | |
| • Number of Symbols | 108* | "(at least 6)" |
| • Symbol 1 Data Group | 164 | |
| • • Object Data Group | 166 | |
| • • • Symbol Designator | 110* | "U1A" |
| • • • Symbol Name | 112* | "54F00:A" |
| • • • Symbol Structure | 114* | "Two-Input NAND Gate" |
| • • Node Data Group | 170 | |
| • • • Number of Nodes | 118* | "3" |
| • • • Node 1 Data Group | 172 | |
| • • • • Node Name | 120* | "1:Input 1A" |
| • • • • Node Location | 122* | "X1,Y1" |
| • • • • Node Net | 124* | "Refresh Clock" |
| • • • Node 2 Data Group | 170 | |
| • • • • Node Name | 120* | "2:Input 1B" |
| • • • • Node Location | 122* | "X2,Y2" |
| • • • • Node Net | 124* | "Refresh Gate" |
| • • • Node 3 Data Group | 170 | |
| • • • • Node Name | 120* | "3:Output 1Y" |
| • • • • Node Location | 122* | "X3,Y3" |
| • • • • Node Net | 124* | "Gated Refresh Clock" |
| • Symbol 2 Data Group | 164 | |
| • • Object Data Group | 166 | |
| • • • Symbol Designator | 110* | "U1B" |
| • • • Symbol Name | 112* | "54F00:B" |
| • • • Symbol Structure | 114* | "Two-Input NAND Gate" |
| • • Node Data Group | 170 | |
| • • • Number of Nodes | 118* | "3" |
| • • • Node 1 Data Group | 172 | |
| • • • • Node Name | 120* | "4:Input 2A" |
| • • • • Node Location | 122* | "X1,Y1" |
| • • • • Node Net | 124* | "Net #4" |
| • • • Node 2 Data Group | 172 | |
| • • • • Node Name | 120* | "5:Input 2B" |
| • • • • Node Location | 122* | "X2,Y2" |

-continued

| Data Group/Datum | Ref | Example |
|---|---|---|
| • • • • Node Net | 124* | "Net #5" |
| • • • Node 3 Data Group | 172 | |
| • • • • Node Name | 120* | "6:Output 2Y" |
| • • • • Node Location | 122* | "X3,Y3" |
| • • • • Node Net | 124* | "Net #6" |
| • Symbol 3 Data Group | 164 | |
| • • Object Data Group | 166 | |
| • • • Symbol Designator | 110* | "U1C" |
| • • • Symbol Name | 112* | "54F00:C" |
| • • • Symbol Structure | 114* | "Two-input NAND Gate" |
| • • Node Data Group | 170 | |
| • • • Number of Nodes | 118* | "3" |
| • • • Node 1 Data Group | 172 | |
| • • • • Node Name | 120* | "9:Input 3A" |
| • • • • Node Location | 122* | "X1,Y1" |
| • • • • Node Net | 124* | "Net #9" |
| • • • Node 2 Data Group | 172 | |
| • • • • Node Name | 120* | "10:Input 3B" |
| • • • • Node Location | 122* | "X2,Y2" |
| • • • • Node Net | 124* | "Net #10" |
| • • • Node 3 Data Group | 172 | |
| • • • • Node Name | 120* | "8:Output 3Y" |
| • • • • Node Location | 122* | "X3,Y3" |
| • • • • Node Net | 124* | "Net #8" |
| • Symbol 4 Data Group | 164 | |
| • • Object Data Group | 166 | |
| • • • Symbol Designator | 110* | "U1D" |
| • • • Symbol Name | 112* | "54F00:D" |
| • • • Symbol Structure | 114* | "Two-Input NAND Gate" |
| • • Node Data Group | 170 | |
| • • • Number of Nodes | 118* | "3" |
| • • • Node 1 Data Group | 172 | |
| • • • • Node Name | 120* | "12:Input 4A" |
| • • • • Node Location | 122* | "X1,Y1" |
| • • • • Node Net | 124* | "Net #12" |
| • • • Node 2 Data Group | 172 | |
| • • • • Node Name | 120* | "13:Input 4B" |
| • • • • Node Location | 122* | "X2,Y2" |
| • • • • Node Net | 124* | "Net #13" |
| • • • Node 3 Data Group | 172 | |
| • • • • Node Name | 120* | "11:Output 4Y" |
| • • • • Node Location | 122* | "X3,Y3" |
| • • • • Node Net | 124* | "Net #11" |
| • Symbol 5 Data Group | 164 | |
| • • Object Data Group | 166 | |
| • • • Symbol Designator | 110* | "U1E" |
| • • • Symbol Name | 112* | "54F00:E" |
| • • • Symbol Structure | 114* | "Vcc" |
| • • Node Data Group | 170 | |
| • • • Number of Nodes | 118* | "1" |
| • • • Node 1 Data Group | 172 | |
| • • • • Node Name | 120* | "14:Vcc" |
| • • • • Node Location | 122* | "X4,Y4" |
| • • • • Node Net | 124* | "Vcc" |
| • Symbol 6 Data Group | 164 | |
| • • Object Data Group | 166 | |
| • • • Symbol Designator | 110* | "U1F" |
| • • • Symbol Name | 112* | "54F00:F" |
| • • • Symbol Structure | 114* | "Gnd" |
| • • Node Data Group | 170 | |
| • • • Number of Nodes | 118* | "1" |
| • • • Node 1 Data Group | 172 | |
| • • • • Node Name | 120* | "7:Gnd" |
| • • • • Node Location | 122* | "X5,Y5" |
| • • • • Node Net | 124* | "Gnd" |

Process 28 performs verify design data task 126. The system display design table 106 (perhaps in industry-standard graphical outline form), and the operator then inspects and edits the data. Once all data have been edited and verified, they are written back to design table 106.

Process 28 next performs group symbols task 128. The operator and the system together place symbols 40 into groups. A group is a logical gathering of symbols 40 of an order less than a page (multiple groups fit on a single page of finished schematic diagram 32). The system displays the data from design table 106. The system then groups the data into functional groups of symbols 40 and the operator modifies the grouping. This is done iteratively until the operator is satisfied with the grouping. A symbol group datum 130 (see FIG. 12) for each symbol 40 is then written to design table 106.

Process 28 then performs paginate symbols task 132. During task 132, the operator and the system together place the previously-selected and grouped symbols 40 into pages. A page is the amount of symbolic data that will fit on a single page of finished schematic diagram 32. The number of symbols 40 that will fit on a single page is dependent upon the absolute size of the page, the scale of symbols 40, and the desired symbol density.

The system displays the data from design table 106 by group. The system then gathers the data into pages of an operator-specified size and density and the operator modifies the pagination. Again, this is done iteratively until the operator is satisfied with the pagination. A symbol page datum 134 (see FIG. 12), for each symbol 40 is then written to design table 106.

Next, process 28 performs a position symbols task 136. The operator and the system together place each of the previously-selected, grouped, and paginated symbols 40 into their desired positions on each page of finished schematic diagram 32. This placement may involve specifying the placement of each symbol 40 in Cartesian coordinates relative to an origin on each page, coupled with a symbol rotation factor. This produces an "x,y,θ" data parameter for each symbol. During task 136 the preferred embodiment uses autoplacement routines which are conventionally used with printed circuit board layout.

During task 136, the system displays the data from design table 106. The system then places and rotates each symbol 40 in its best guess of proper position and orientation, and the operator modifies that placement and orientation. This, too, is done iteratively until all symbols 40 have been positioned and oriented on all pages and the operator is satisfied with the placement and orientation. A symbol position datum 138 (see FIG. 12), for each symbol 40 is then written to design table 106.

The next task performed by process 28 is route net connections task 140. The operator and the system together determine the routing of the nets 42 between all nodes 41 of all previously-positioned symbols 40 on each page of finished schematic diagram 32. This routing may involve specifying the placement of each segment 43 and each junction 44 of each net 42 (see FIG. 4).

A "segment" 43 is a straight-line portion of a net 42 defined by its termini. In Cartesian coordinates these termini are expressed as an "$x_1,y_1,x_2,y_2$" data parameter, where "$x_1,y_1$" and "$x_2,y_2$" define the starting and ending termini.

A "junction" 44 is a locus where at least two segments 43 of the same net 42 join in a tee or cross configuration. Again, in Cartesian coordinates this locus is expressed as an "x,y" data parameter.

To perform the routing, the system first scans all node net data 124 for each node 41 of each symbol 40 in design table 106. It then creates a cross-listing of all nodes 41 for each net 42 and determines a number of nets datum 142. Then, taking each net 42 in turn, the system displays the cross-listing and routes the nets 42 as a series of segments 43 and junctions 44 connecting all appropriate nodes 41, using its best guess for position and path. This is accomplished by treating all symbols 40 as solid objects (nets 42 route around symbols 40) and each net 42 as though it were on its own "layer" (nets 42 may cross each other without connection, a junction 44 is used to join parts of the same net 42). The operator modifies that routing as required. This entire routing-plus-modification task is done iteratively, using conventional autorouting routines known in the art of printed circuit board layout, until all routing has been completed to the operator's satisfaction.

During task 140, the system writes net data group 162 (see FIG. 12) to design table 106. Net data group 162 includes the following data: a number of nets datum 142; for each net 42, a net designator datum 144, a number of segments datum 146, and a number of junctions datum 150; for each segment 43, a segment termini datum 148; and for each junction 44, a datum junction locus 152. Net data group 162 may constitute a significant portion of design table 106, often the greater portion. In the preferred embodiment, design table 106 is handled as two separate tables on disk: symbol data table 160 and net data table 162.

After task 140, process 28 performs write output files task 154. During task 154 the system, upon operator command, reads the data from design table 106, structures and formats that data in keeping with the requirements of the previously selected output application (see FIG. 7), and writes the processed data to schematic application page files 30 that are the output of schematic diagram synthesizer program 20.

The operator may instruct the system to repeat generate schematic page data process 28 as often as required unit the desired finished schematic diagram 32 is achieved. Multiple finished schematic diagrams 32 with differing layouts may also be produced by repeating process 28

Returning briefly to FIG. 1, it may be noted that a secondary line of processes and tasks exists in the form of schematic drawing program 156. This program, a commercial product compatible with the previously selected output application (see FIG. 7), produces the finished schematic diagram 32. This is accomplished in a task 158 which plots, draws, or displays finished schematic diagram 32.

Figure 12:
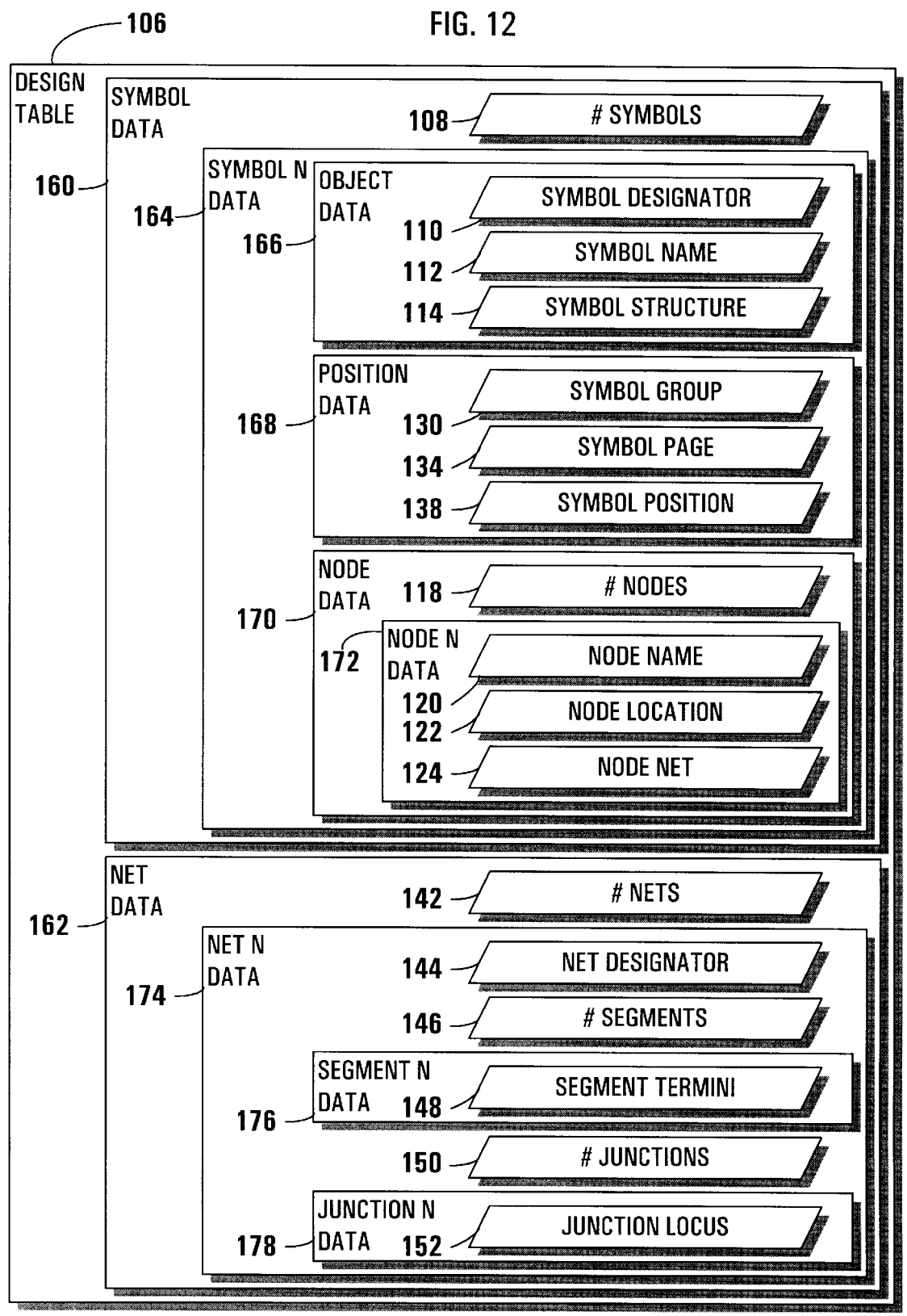
FIG. 12 is a schema depicting exemplary design table data.

Throughout the discussion of the preferred embodiment, emphasis has been placed upon the data in design table 106. FIG. 12 depicts a detailed view of an exemplary embodiment of design table 106. In this embodiment of design table 106, the data comprise two primary data groups, symbol data group 160, and net data group 162. These data groups may themselves be realized as separate data tables. The specific structure of design table 106 and its components is irrelevant to this discussion, as any person skilled in the art may readily conceive alternate embodiments.

Symbol data group 160 is a major data group comprising those data that pertain to the specific graphical symbols incorporated into the finished schematic diagram 32. Symbol data group 160 includes a number of symbols datum 108 and a symbol N data group 164.

Number of symbols datum 108 has a value indicating the total number of symbols 40 in the finished schematic diagram 32. Data item 108 is the sum of the number of symbols 40 per part 36, derived by correlating each part name 66 with each object name 94, for each reference designator 64 (see FIG. 10).

Symbol N data group 164, includes those data that define a given symbol 40, differentiating that symbol 40 from all other symbols 40 in the finished schematic diagram 32. Symbol N data group 164, is so named to indicate that it is repeated N times, where N in this instance is the value of number of symbols datum 108. E.g., if these are 256 symbols 40 in the finished schematic diagram 32, there are 256 versions of data group 164, properly called symbol 1 data, symbol 2 data, . . . , symbol 256 data.

Symbol N data group 164, includes an object data group 166, a position data group 168, and a node data group 170.

Object data group 166 includes those data that directly define the specific symbol 40 in question. Object data group 166 includes a symbol designator datum 110, a symbol name datum 112, and a symbol structure datum 114.

Symbol designator datum 110 characterizes a schematic-unique label for the given symbol 40. Symbol designator datum 110 is derived from reference designator 64 and part name 66 in physical attributes 60 and object name 94 in graphical attributes 90 (see FIG. 10). A typical content for symbol designator datum 110 might be "U1A".

Symbol name datum 112 conveys the industry-standard name for the given symbol 40. Symbol name datum 112 is derived from both part name 66 in physical attributes 60 and object name 94 in graphical attributes 90 (see FIG. 10). A typical content for symbol name datum 112 might be "54F00:A".

Symbol structure datum 114, sets forth a specification of the graphical structure of the given symbol 40, usually encoded. Symbol structure datum 114 is derived from object structure 96 in graphical attributes 90 (see FIG. 10). A typical content for symbol structure datum 114 might be "two-input NAND gate".

Position data group 168 includes those data that define the position and orientation of the given symbol 40 within the finished schematic diagram 32. Position data group 168 includes a symbol group datum 130, a symbol page datum 134, and a symbol position datum 138.

Symbol group datum 130 defines a designation of the specific group in which the given symbol 40 will reside on the appropriate page of the finished schematic diagram 32. Symbol group datum 130 may be generated with operator interaction during group symbols task 128 (see FIG. 11). A typical content of symbol group datum 130 might be "Group A".

Symbol page datum 134 defines a designation of the specific page upon which the given symbol 40 will reside in the finished schematic diagram 32. Symbol page datum 134 may be generated with operator interaction during paginate symbols task 132 (see FIG. 11). A typical content of symbol page datum 134 might be "Page 1".

Symbol position datum 138 identifies the position and orientation of the given symbol 40 on the specified page of the finished schematic diagram 32. Symbol position datum 138 may be generated with operator interaction during position symbols task 136 (see FIG. 11). A typical content of symbol position datum 138 might be Cartesian and rotational coordinates in "x,y,θ" format, "x" and "y" being the abscissa and ordinate depicting the position of symbol 40 on the page and "θ" being the rotation of symbol 40 at that location.

Node data group 170 includes those data that pertaining to the nodes 41 of given symbol 40. A node 41 is a point at which a symbol 40 connects with the rest of finished schematic diagram 32. Node data group 170 includes a number of nodes datum 118, and a node N data group 172.

Number of nodes datum 118 has a value indicating the total number of nodes 41 for the given symbol 40. Number of nodes datum 118 is derived from a merging of pin number 70 in physical attributes 60 and connection name 100 in graphical attributes 90 (see FIG. 10).

Node N data group 172 includes those data that define a given node 41, differentiating that node 41 from all other nodes 41 of the given symbol 40. Node N data group 172 is so named to indicate that it is repeated N times, where N in this instance is the value of number of nodes datum 118. E.g., if there are six nodes 41 for the given symbol 40, there will be six versions of data group 172, properly called node 1 data, node 2 data, . . . , node 6 data.

Node N data 172 includes a node name datum 120, a node location datum 122, and a node net datum 124.

Node name datum 120 conveys a symbol-unique designator for the given node 41. Node name datum 120 is derived from pin number 70 in physical attributes 60 and connection name 100 in graphical attributes 90 (see FIG. 10). A typical content of node name datum 120 might be "1:Input 1A".

Node location datum 122 specifies the location of the given node 41 relative to the given symbol 40. Node location datum 122 is derived from connection location 102 in graphical attributes 90 (see FIG. 10). A typical content of node location datum 122 might be Cartesian coordinates in "x,y" format, "x" and "y" being the abscissa and ordinate depicting the position of node 41 relative to an origin and axis contained within symbol 40 itself.

Node net datum 124 designates the net attached to the given node 41. Node net datum 124 is derived from net name 72 in physical attributes 60 (see FIG. 10). A typical content of node net datum 124 might be "Refresh Clock".

Net data group 162 includes those data that pertain to the interconnections between the specific nodes 41 of the specific symbols 40 in the finished schematic diagram 32. Net data group 162 is comprised of a number of nets datum 142, and a net N data group 174.

Number of nets datum 142 conveys a value indicating the total number of nets 42 in the finished schematic diagram 32. Number of nets datum 142 is derived from a count of differing node net data 124 for each of the nodes 41 of each of the symbols 40 in the finished schematic diagram 32.

Net N data group 174 includes those data that define a given net 42, differentiating that net 42 from all other nets 42 in the finished schematic diagram 32. Net N data group 174 is so named to indicate that it is repeated N times, where N in this instance is the value of number of nets datum 142. E.g., if there are 128 nets 42 in the finished schematic diagram 32, there are 128 versions of data group 174, properly called net 1 data, net 2 data, . . . , net 128 data.

Net N data group 174 includes a net designator datum 144, a number of segments datum 146, a segment N data group 176, a number of junctions datum 150, and a junction N data group 178.

Net designator datum 144 designates a schematic-unique label for the given net 42. Net designator datum 144 is derived from the totality of node net data 124, and through them from net name 72 in physical attributes 60 (see FIG. 10).

Number of segments datum 146 conveys a value indicating the total number of line segments 43 required to route the given net 42 to all required nodes 41. Number of segments datum 146 may be determined with operator interaction during route net connections task 140, (see FIG. 11).

Segment N data group 176 includes those data that define a given segment 43 of the given net 42 as differentiated from all other segments 43 of that net 42. Segment N data group 176 is so named to indicate that it is repeated N times, where N in this instance is the value of number of segments datum 146. E.g., if there are eight segments 43 in a given net 42, there are eight versions of data group 176, properly called segment 1 data, segment 2 data, . . . , segment 8 data.

Segment N data group 176 includes a segment termini datum 148. Segment termini datum 148 specifies the given segment 43 through a designation of the positions of the termini of the given segment 43 of the given net 42 on the finished schematic diagram 32. Segment termini datum 148 positions may be generated with operator interaction during route net connections task 140 (see FIG. 11). A typical content of segment termini datum 148 might be Cartesian coordinates in "$x_1,y_1,x_2,y_2$" format, "$x_1$" and "$Y_1$" being the abscissa and ordinate depicting the position the starting terminus of segment 43 and "$x_2$" and "$Y_2$" being those of the ending terminus.

Number of junctions datum 150 conveys the total number of inter-segment junctions 44 required to route the given net 42 to all required nodes 41. Number of junctions datum 150 may be determined with operator interaction during route net connections task 140 (see FIG. 11).

Junction N data group 178 includes those data that define a given junction 44 of the given net 42 as differentiated from all other junctions 44 of that net 42. Junction N data group 178 is so named to indicate that it is repeated N times, where N in this instance is the value of number of junctions datum 150. E.g., if there are six junctions 44 in a given net 42, there are six versions of data group 178, properly called junction 1 data, junction 2 data, junction 6 data.

Junction N data group 178 includes a junction locus datum 152. Junction locus datum 152 specifies the given junction 44 of the given net 42 through a designation of its position on the finished schematic diagram 32. Junction locus datum 152 positions may be generated with operator interaction during route net connections task 140 (see FIG. 11). A typical example of junction locus datum 152 data might contain Cartesian coordinates in "x,y" format, "x" and "y" being the abscissa and ordinate depicting the position of the junction. Those skilled in the art may readily discern that design table 106 may in actuality be more that one data table. In fact, in the preferred embodiment it is realized as a symbol data table 160 and a net data table 162. Likewise, these data may reside in primary memory only or as a disk file.

In summary, the current invention provides an improved schematic diagram synthesizer program 20, allowing an operator to produce complete schematic application page files 30 from a manufacturer's printed circuit board design files. These schematic application page files 30 are then converted into a finished schematic diagram 32.

Although the preferred embodiment of the invention has been illustrated and described in detail, it will be readily apparent to those skilled in the art that various modifications may be made therein without departing from the spirit of the invention or from the scope of the appended claims. For example, the sequencing of processes and tasks and the organization of tables may be arranged differently while achieving equivalent results.

Those skilled in the art will appreciate that the methodology discussed above is exemplary and provided for the sake of clarity. Those skilled in the art may readily devise alternate methodologies.

What is claimed is:

1. A method for retroactively synthesizing a schematic diagram for a pre-existing printed circuit board utilizing a schematic drawing program, said method comprising the steps of:

extracting physical attributes from a physical design data file for said pre-existing printed circuit board;

extracting graphical attributes from a graphical symbol data file for said schematic drawing program; and integrating said physical attributes and said graphical attributes to produce a schematic application page file for said schematic drawing program.

2. A method for retroactively synthesizing a schematic diagram as claimed in claim 1 wherein:

said pre-existing printed circuit board has a plurality of parts and at least one of said parts has a plurality of pins; and said method additionally comprises the step of partitioning said physical attributes into physical object data comprising a board-unique reference designator and a part name for each of said parts of said pre-existing printed circuit board, and physical connectivity data comprising a part-unique pin number and a board-unique net name for each of said pins of each of said parts of said pre-existing printed circuit board.

3. A method for retroactively synthesizing a schematic diagram as claimed in claim 1 wherein:

said pre-existing printed circuit board has a plurality of parts and at least one of said parts has a plurality of pins;

said method additionally comprises the step of partitioning said physical attributes into physical object data and physical connectivity data;

said physical object data comprises:
 a board-unique reference designator which uniquely identifies each of said parts within a printed circuit board domain, and
 a part name for each of said parts of said pre-existing printed circuit board using industry-standard nomenclature for said part; and said physical connectivity data comprises:
 a part-unique pin number which uniquely identifies each pin of each of said parts within a part domain, and
 a board-unique net name for each pin of each of said parts, said board-unique net name being common to all of said pins sharing a common electrical connection upon said pre-existing printed circuit board.

4. A method for retroactively synthesizing a schematic diagram as claimed in claim 1 wherein:

said schematic diagram includes a plurality of symbols and at least one of said symbols has a plurality of connectivity nodes, said symbols and said nodes being characterized in said graphical symbol data file for said schematic drawing program; and said method additionally comprises the step of partitioning said graphical attributes into graphical object data comprising an object name and an object structure designation for each of said symbols, and graphical connectivity data comprising a symbol-unique connection name and a symbol-unique connection location for each of said nodes of each of said symbols.

5. A method for retroactively synthesizing a schematic diagram as claimed in claim 3 wherein:

said schematic diagram includes a plurality of symbols and at least one of said symbols has a plurality of connectivity nodes, said symbols and said nodes being characterized in said graphical symbol data file for said schematic drawing program;

said method additionally comprises the step of partitioning said graphical attributes into graphical object data and graphical connectivity data;

said graphical object data comprises:
 an object name for each of said symbols using an industry-standard nomenclature for said each symbol, and
 an object structure designation providing a diagrammatic depiction of each of said symbols; and said graphical connectivity data comprises:
 a symbol-unique connection name which uniquely identifies each of said nodes of each of said symbols within a symbol domain, and
 a symbol-unique connection location defining a position for each of said nodes of each of said symbols relative to said each symbol.

6. A method for retroactively synthesizing a schematic diagram as claimed in claim 5 additionally comprising the step of grouping said symbols relative to one another for pagination of said schematic diagram.

7. A method for retroactively synthesizing a schematic diagram as claimed in claim 5 additionally comprising the steps of:

defining a page on which at least a portion of said symbols appear in said schematic diagram; and defining positions for said portion of said symbols relative to said page.

8. A method for retroactively synthesizing a schematic diagram as claimed in claim 5 additionally comprising the steps of:

identifying positions for said symbols relative to one another; and defining a path for each of said board-unique net names, said path interconnecting a portion of said nodes of said symbols.

9. A method for retroactively synthesizing schematic diagrams as claimed in claim 1 additionally comprising the step of graphically fixing said schematic application page file for viewing on a visual medium.

10. A method for retroactively synthesizing a schematic diagram, utilizing a schematic drawing program, for a pre-existing printed circuit board wherein said pre-existing printed circuit board has a plurality of parts and at least one of said parts has a plurality of pins, and said schematic diagram includes a plurality of symbols and at least one of said symbols has a plurality of connectivity nodes, said symbols and said nodes being contained in a graphical symbol data file for said schematic drawing program, and said method comprises the steps of:

extracting physical attributes from a physical design data file for said pre-existing printed circuit board;

partitioning said physical attributes into physical object data comprising a board-unique reference designator and a part name for each of said parts of said pre-existing printed circuit board, and physical connectivity data comprising a part-unique pin number and a board-unique net name for each pin of each of said parts of said pre-existing printed circuit board;

extracting graphical attributes from said graphical symbol data file for said schematic drawing program;

partitioning said graphical attributes into graphical object data comprising an object name and an object structure designation for each symbol, and graphical connectivity data comprising a symbol-unique connection name and a symbol-unique connection location for each of said nodes of each of said symbols;

integrating said physical attributes and said graphical attributes to produce a schematic application page file; and graphically fixing said schematic application page file for viewing on a visual medium.

11. A method for retroactively synthesizing a schematic diagram as claimed in claim 10 wherein said integrating step comprises the step of associating said part names with said object names.

12. A method for retroactively synthesizing a schematic diagram as claimed in claim 11 wherein said integrating step additionally comprises the step of associating said part-unique pin numbers with said symbol-unique connection names.

13. A method for retroactively synthesizing a schematic diagram as claimed in claim 12 additionally comprising the step of grouping said symbols relative to one another for pagination of said schematic diagram onto one or more pages.

14. A method for retroactively synthesizing a schematic diagram as claimed in claim 13 additionally comprising the step of, for each of said schematic diagram pages, defining positions for said symbols grouped on said page relative to said page.

15. A method for retroactively synthesizing a schematic diagram as claimed in claim 14 additionally comprising the step of defining a path for each of said board-unique net names, said path interconnecting a portion of said nodes of said symbols.

16. A computer program embodied on a computer-readable medium for retroactively synthesizing a schematic diagram, utilizing a schematic drawing program, for a pre-existing printed circuit board, said program comprising:

a first code segment for extracting physical attributes from a physical design data file for said pre-existing printed circuit board;

a second code segment for extracting graphical attributes from a graphical symbol data file for said schematic drawing program; and a third code segment for integrating said physical attributes and said graphical attributes to produce a schematic application page file.

17. A computer program as claimed in claim 16 wherein:

said pre-existing printed circuit board has a plurality of parts and at least one of said parts has a plurality of pins;

said physical attributes are partitioned into physical object data comprising a board-unique reference designator and part name for each of said parts of said pre-existing printed circuit board, and physical connectivity data comprising a part-unique pin number and a board-unique net name for each pin of each of said parts of said pre-existing printed circuit board;

said schematic diagram includes a plurality of symbols and at least one of said symbols has a plurality of connectivity nodes, said symbols and said nodes being characterized in said graphical symbol data file for said schematic drawing program;

said graphical attributes are partitioned into graphical object data comprising an object name and an object structure designation for each symbol, and graphical connectivity data comprising a symbol-unique connection name and a symbol-unique connection location for each node of each symbol;

said third code segment further includes code for associating said part names with said object names; and said third code segment further includes code for associating said part-unique pin numbers with said object names.

* * * * *